US006815781B2

United States Patent
Vyvoda et al.

(10) Patent No.: US 6,815,781 B2
(45) Date of Patent: Nov. 9, 2004

(54) INVERTED STAGGERED THIN FILM TRANSISTOR WITH SALICIDED SOURCE/DRAIN STRUCTURES AND METHOD OF MAKING SAME

(75) Inventors: Michael A. Vyvoda, San Jose, CA (US); S. Brad Herner, San Jose, CA (US); Christopher J. Petti, Mountain View, CA (US); Andrew J. Walker, Mountain View, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 18 days.

(21) Appl. No.: 10/270,394

(22) Filed: Oct. 15, 2002

(65) Prior Publication Data

US 2004/0036124 A1 Feb. 26, 2004

Related U.S. Application Data (63) Continuation-in-part of application No. 09/961,278, filed on Sep. 25, 2001, now Pat. No. 6,593,624.

(51) Int. Cl.[7] .......................... H01L 29/75; H01L 29/76; H01L 29/94; H01L 31/062; H01L 31/113; H01L 31/119
(52) U.S. Cl. ...................... 257/377; 257/382; 257/384; 257/390; 257/72
(58) Field of Search .......................... 257/67, 72, 133, 257/382, 377, 383, 384, 385, 388, 59, 135, 132, 58, 122, 315, 316, 66, 390; 349/58, 122

(56) References Cited

U.S. PATENT DOCUMENTS

| 5,089,862 | A | | 2/1992 | Warner, Jr. et al. |
|---|---|---|---|---|
| 5,191,405 | A | | 3/1993 | Tomita et al. |
| 5,306,935 | A | | 4/1994 | Esquivel et al. |
| 5,646,056 | A | * | 7/1997 | Lin et al. ..................... 438/303 |
| 5,668,046 | A | * | 9/1997 | Koh et al. ................... 438/481 |
| 5,952,697 | A | * | 9/1999 | Lee ............................. 257/390 |
| 6,185,122 | B1 | | 2/2001 | Johnson et al. |
| 6,569,707 | B2 | * | 5/2003 | Dimitrakopoulos et al. .. 438/99 |
| 2001/0050442 | A1 | * | 12/2001 | Lee ............................. 257/903 |
| 2001/0055838 | A1 | * | 12/2001 | Walker et al. ............. 438/129 |
| 2002/0028541 | A1 | | 3/2002 | Lee et al. |
| 2002/0093052 | A1 | * | 7/2002 | Masuda ....................... 257/347 |
| 2003/0057435 | A1 | * | 3/2003 | Walker ........................ 257/135 |

OTHER PUBLICATIONS

International Electron Devices Meeting 1990, San Francisco, CA Dec. 9–12, 1990, iedm Technical Digest, 4–Layer 3–D IC Technologies For Parallel Signal Processing, K. Yamazaki, et al. p. 10–13.

Thermal Stability of Cobalt and Nickel Silicides in Amorpho Crystalline Silicon, Abstract of M.C. Poon, IEDM 1997 Prtoc. p. 19.

Alternate Metal Virtual Ground Eprom Array Implemented in a 0.8 μm Process for Very High Density Applications, R. Kazerounian, et al, 1991 IDEM Proc., p. 11.5.1–11.5.4.

* cited by examiner

Primary Examiner—Nathan J. Flynn
Assistant Examiner—Victor A. Mandala, Jr.
(74) Attorney, Agent, or Firm—Foley & Lardner LLP (57) ABSTRACT

A semiconductor device, such as an inverted staggered thin film transistor, includes a gate electrode, a gate insulating layer located above the gate electrode, an active layer located above the gate insulating layer and an insulating fill layer located above the active layer. A first opening and a second opening are located in the insulating fill layer, a first source or drain electrode is located in the first opening and a second source or drain electrode is located in the second opening. At least one of the first and the second source or drain electrodes comprise a polysilicon layer and a metal silicide layer.

40 Claims, 7 Drawing Sheets

INVERTED STAGGERED THIN FILM TRANSISTOR WITH SALICIDED SOURCE/DRAIN STRUCTURES AND METHOD OF MAKING SAME

This application is a continuation-in-part of U.S. application Ser. No. 09/961,278, filed Sep 25, 2001 now U.S. Pat. No. 6,593,624, incorporated herein by reference in its entirety.

FIELD OF THE INVENTION

The present invention is directed generally to semiconductor devices and methods of fabrication and more particularly to a charge storage thin film transistor array and method of fabrication.

BACKGROUND OF THE INVENTION

U.S. published application 20020028541 which was filed as U.S. application Ser. No. 09/927,648, on Aug. 13, 2001 and which is incorporated by reference in its entirety, discloses a monolithic three dimensional array of charge storage devices. In one embodiment in this application, the charge storage devices of the array comprise both top gate staggered and inverted (i.e., bottom gate) staggered thin film transistors. Thin film transistors are called "staggered" when the gate electrode is located on the opposite side of the active layer from the source and drain electrodes. In the inverted staggered thin film transistors, the active layer and the bit lines were both made of polysilicon.

BRIEF SUMMARY OF THE INVENTION

A preferred embodiment of the present invention provides a semiconductor device, comprising a gate electrode, a gate insulating layer located above the gate electrode, an active layer located above the gate insulating layer, an insulating fill layer located above the active layer, a first opening and a second opening located in the insulating fill layer, a first source or drain electrode located in the first opening, and a second source or drain electrode located in the second opening. At least one of the first and the second source or drain electrodes comprises a polysilicon layer and a metal silicide layer.

Another preferred embodiment of the present invention provides a monolithic, three dimensional array of thin film transistors, comprising a substrate an intermediate dielectric layer located above the substrate, a first planarized insulating fill layer located at a first height above the intermediate dielectric layer, a first plurality of openings located in the first planarized insulating fill layer and a plurality of first word lines located in the first plurality of openings in the first planarized insulating fill layer and extending in a first direction. The array further comprises a first gate insulating layer located above the first word lines and above the first insulating fill layer, a first active layer located above the first gate insulating layer, a second insulating fill layer located above the first active layer, a second plurality of openings located in the second insulating fill layer and first bit lines located in the second plurality of openings in the second insulating fill layer, wherein at least one of the first bit lines comprises a first polysilicon layer and a first metal silicide layer, and the first bit lines extend in a second direction different from the first direction. The array further comprises a second active layer located above the first bit lines and above the second insulating fill layer, a second gate insulating layer located above the second active layer, and a plurality of second word lines located above the second gate insulating layer, the second word lines extending in the first direction.

Another preferred embodiment of the present invention provides a method of making a semiconductor device, comprising forming a first gate line layer, patterning the first gate line layer to form a plurality of first gate lines, forming a first insulating fill layer over and between the first gate lines, planarizing the first fill layer coplanar with top surfaces of the first gate lines, forming a first gate insulating layer over the first gate lines and the first fill layer, forming a first active layer over the first gate insulating layer and forming a second insulating fill layer over the first active layer. The method further comprises patterning the second insulating fill layer such that first portions of the first active layer are covered by the second insulating fill layer and openings in the second insulating fill layer expose second portions of the first active layer, forming a first source/drain line film comprising a first polysilicon layer and a first metal silicide layer in the openings in the second insulating fill layer, and planarizing the first source/drain line film such that first source and drain electrodes remain in the openings in the second insulating fill layer, and top surfaces of the first source and drain electrodes are coplanar with a top surface of the second insulating fill layer.

Another preferred embodiment of the present invention provides a method of making an inverted staggered thin film transistor, comprising forming a gate electrode, forming a gate insulating layer over the gate electrode, forming an active layer over the gate insulating layer, forming an insulating fill layer over the active layer, patterning the insulating fill layer such that first portions of the active layer are covered by the insulating fill layer and openings in the insulating fill layer expose second portions of the active layer, forming a source/drain line film comprising a first polysilicon layer and a metal silicide layer in the openings in the insulating fill layer, and planarizing the source/drain line film such that source and drain electrodes remain in the openings in the insulating fill layer, and top surfaces of the source and drain electrodes are coplanar with a top surface of the insulating fill layer.

DETAILED DESCRIPTION OF THE PREFERRED EMBODIMENTS

The present inventor has realized that the conductivity of the bit lines of the inverted staggered transistors may be improved by adding a silicide layer to the polysilicon layer of the bit lines. The silicide layer may be located below the bit line polysilicon layer, above the bit line polysilicon layer or between two bit line polysilicon layers. The silicide and polysilicon bit lines are preferably located in openings in an insulating fill layer to enhance the planarity of the device.

Figure 1:
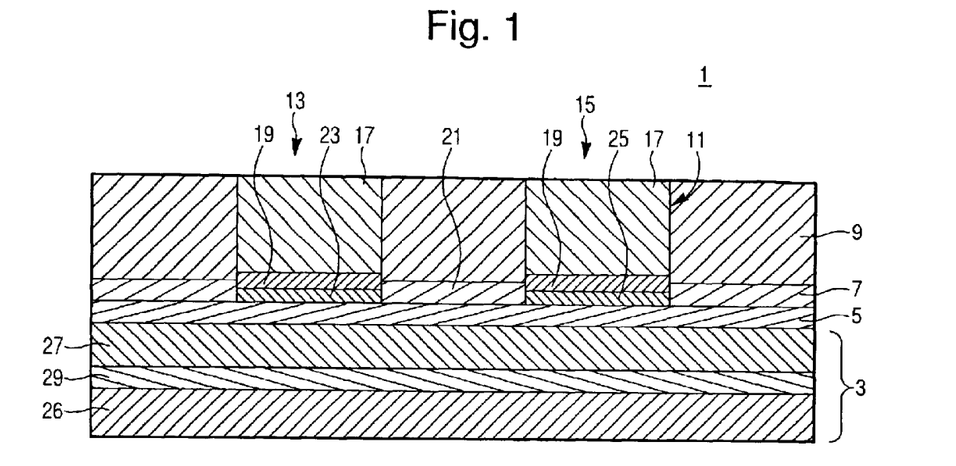
FIG. 1 is a side cross sectional view of a thin film transistor according to the first preferred embodiment of the present invention.

FIG. 1 illustrates an inverted staggered thin film transistor 1 according to a first preferred embodiment of the present invention. The transistor 1 includes a gate electrode 3, a gate insulating layer 5 located above the gate electrode 3, an active layer 7 located above the gate insulating layer 5 and an insulating fill layer 9 located above the active layer 7. At least two openings 11 are located in the insulating fill layer 9. Source 13 and drain 15 electrodes are located in the at least two openings 11. It should be noted that each electrode 13, 15 can act as a source or a drain electrode, depending on the direction of the current flow. Furthermore, each electrode 13, 15 can act as a source electrode for one transistor and as a drain electrode for an adjacent transistor in an array of transistors.

Preferably, a top surface of the source 13 and drain 15 electrodes is at least substantially coplanar with a top surface of the insulating fill layer 9. The source 13 and drain 15 electrodes preferably comprise a polysilicon layer 17 and a metal silicide layer 19. As shown in FIG. 1, layers 17 and 19 are not continuous, but portions of layers 17 and 19 are located in the openings 11.

In the transistor 1 of the first preferred embodiment, the metal silicide layer 19 is located in contact with the active layer 7 and the polysilicon layer 17 is located above the metal silicide layer 19. Thus, the top surface of the polysilicon layer 17 is coplanar with a top surface of the insulating fill layer 9. Preferably, the transistor 1 source 23 and drain 25 regions are located in the active layer 7 in contact with the source 13 and drain 15 electrodes. A transistor 1 channel region 21 is located in the active layer 7 between the source 23 and drain 25 regions and below the insulating fill layer 9.

It should be noted that each region 23, 25 can act as a source or a drain of the transistor 1, depending on the direction of current flow. Furthermore, in an array of transistors, each region 23, 25 can act as a source for one transistor and as a drain for an adjacent transistor.

The gate electrode 3, gate insulating layer 5, active layer 7, insulating fill layer 9 and the source 13 and drain 15 electrodes may comprise any suitable materials. The gate electrode 3 may comprise any suitable conductive material. Preferably, the gate electrode 3 comprises a first heavily doped gate polysilicon layer 27 over a gate metal silicide layer 29. If desired, a second heavily doped gate polysilicon layer 26 may be located below the gate metal silicide layer 29. Alternatively, the gate metal silicide layer 29 may be eliminated to reduce processing cost or replaced with another conductive layer or film, such as a titanium silicide/titanium nitride film or a titanium nitride/tungsten/titanium nitride film.

The gate insulating layer 5 may comprise any one or more insulating materials, such as silicon dioxide, silicon nitride or silicon oxynitride. Preferably, the gate insulating layer comprises a portion of a charge storage region.

The charge storage region comprises either a dielectric isolated floating gate, an insulating layer containing conductive nanocrystals or a composite dielectric film comprising a tunneling layer, a charge storage layer and a blocking oxide. For example, the charge storage region may comprise a polysilicon floating gate between a tunneling silicon oxide layer and a blocking silicon oxide layer. Alternatively, the charge storage region may comprise a silicon dioxide layer with aluminum or other metal nanocrystals, as disclosed in U.S. published application 20020028541, incorporated herein by reference in its entirety. Alternatively, the charge storage region may comprise the composite dielectric film comprising a silicon oxide tunneling layer, a silicon nitride or oxynitride charge storage layer and a blocking silicon oxide layer.

The active layer 7 may comprise any semiconductor layer, preferably polysilicon or amorphous silicon. The source 23 and drain 25 regions preferably comprise heavily doped semiconductor regions of a first conductivity type (i.e., N+ or P+) in the lightly doped active layer 7 of a second conductivity type (i.e., P− or N−).

The insulating fill layer 9 may comprise any one or more insulating material, such as silicon oxide, silicon oxynitride, phosphosilicate glass (PSG), borophosphosilicate glass (BPSG), borosilicate glass (BSG), spin-on glass, a polymer dielectric layer (such as polyimide, etc.), and/or any other desired insulating material, such as a silicon oxide layer deposited by a plasma enhanced chemical vapor deposition (PECVD) or a high density plasma (HDP) method. Preferably, layer 9 has a substantially planar top surface.

The polysilicon layer 17 that makes up a portion of the source 13 and drain 15 electrodes preferably comprises a heavily doped polysilicon layer of the first conductivity type. The metal silicide layer 19 that makes up the other portion of the source 13 and drain 15 electrodes preferably comprises a cobalt silicide layer. Alternatively, layer 19 may comprise other silicide layers, such as a titanium silicide or nickel silicide layer. While the source 13 and drain 15 electrodes have been described as comprising two layers 17 and 19, additional layers and materials may be added to these electrodes 13 and 15, if desired.

As discussed above, in a preferred aspect of the present invention, the inverted staggered thin film transistor 1 preferably contains a charge storage region and is used in a memory device, such as in an erasable programmable read only memory (EPROM) or in an electrically erasable programmable read only memory (EEPROM). In this case, the transistor source and drain electrodes or lines are referred to as bit lines and the gate electrode or line is referred to as a word line. Preferably, the gate electrode 3 comprises a portion of a gate line that extends below the source 23 and drain 25 regions in the direction parallel to the source 23 to drain 25 direction. Preferably, the source 13 and drain 15 electrodes comprise portions of respective bit lines that extend perpendicular to the source 23 to drain 25 direction.

However, the transistor 1 may be used for other applications. The transistor 1 containing a gate insulating layer 5 rather than a charge storage region may be used in complementary metal oxide semiconductor (CMOS) devices for logic (such as microprocessor) or memory (such as dynamic or static random access memory) applications.

Figure 2A:
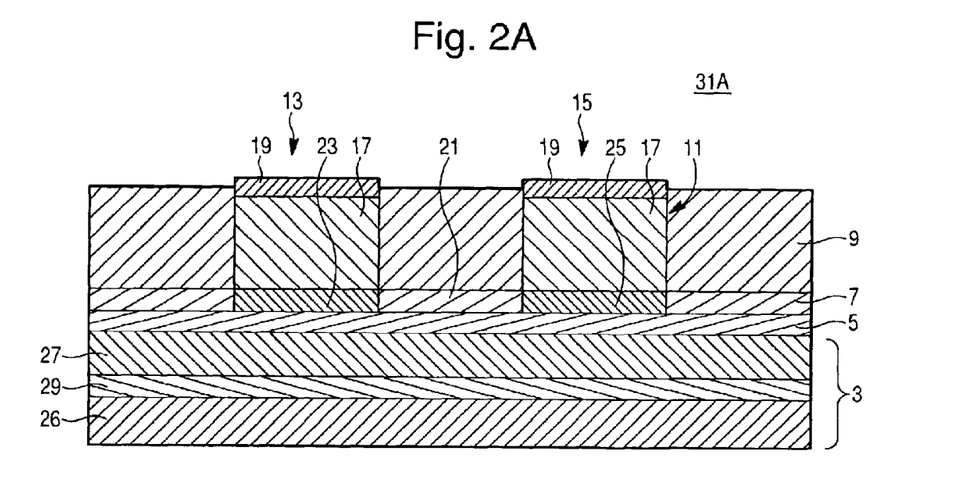
FIGS. 2A and 2B are side cross sectional views of thin film transistors according to the second preferred embodiment of the present invention.

FIG. 2A illustrates an inverted staggered thin film transistor 31A according to one aspect of the second preferred embodiment of the present invention. The transistor 31A is identical to the transistor 1 of the first preferred embodiment, except that in the source 13 and drain 15 electrodes, the metal silicide layer 19 is located above the polysilicon layer 17. Furthermore, the source 13 and drain 15 electrodes are substantially coplanar with a top surface of the insulating fill layer 9. In this preferred aspect, the source 13 and drain 15 electrodes are "substantially coplanar" rather than "exactly coplanar" with a top surface of the insulating fill layer 9 because a portion of the metal silicide layer 19 protrudes slightly above the top surface of layer 9. All other features of transistor 31A are the same as the corresponding features of transistor 1, and will not be described again.

Figure 2B:
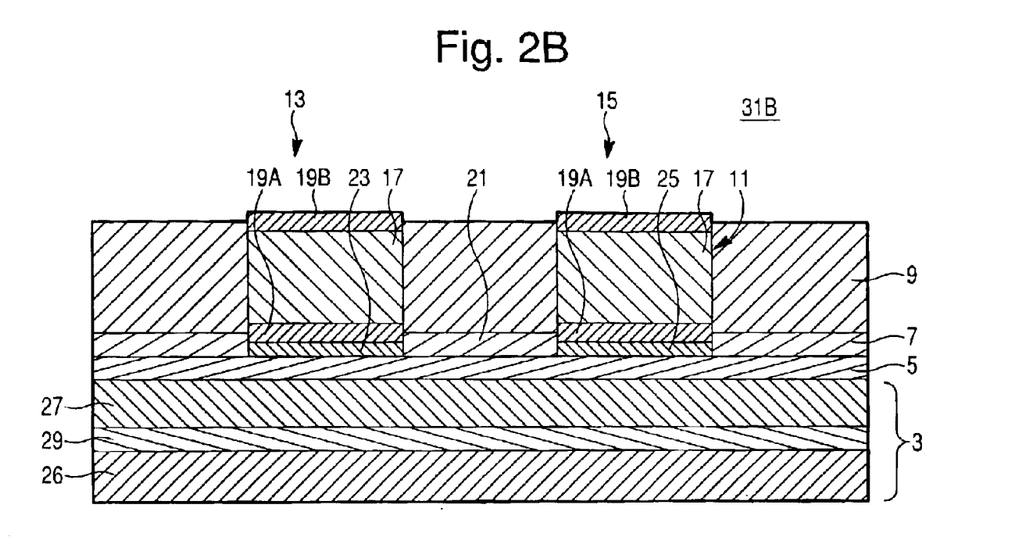

FIG. 2B illustrates an inverted staggered thin film transistor 31 B according to another aspect of the second preferred embodiment. As shown in FIG. 2B, a first metal silicide layer 19A is located in contact with the source 23 and drain 23 regions in the active layer 7. The polysilicon layer 17 is located above the metal silicide layer 19A. A second metal silicide layer 19B is located above the polysilicon layer 17 in the source 13 and drain 15 electrodes. Thus, the source 13 and drain 15 electrodes contain a polysilicon layer located between two metal silicide layers to improve the conductivity of the transistor 31B.

Figure 3:
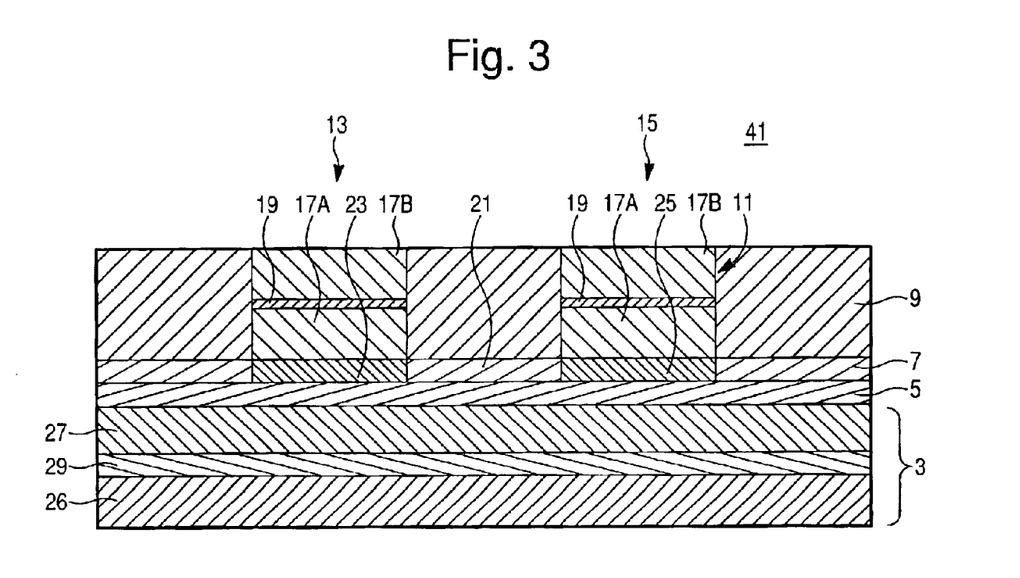
FIG. 3 is a side cross sectional view of thin a film transistor according to the third preferred embodiment of the present invention.

FIG. 3 illustrates an inverted staggered thin film transistor 41 according to the third preferred embodiment of the present invention. The transistor 41 is identical to the transistor 1 of the first preferred embodiment, except that in the source 13 and drain 15 electrodes, the metal silicide layer 19 is located between two polysilicon layers 17A and 17B. Thus, the metal suicide layer 19 is arranged in a so-called "parfait" structure in transistor 41. All other features of transistor 41 are the same as the corresponding features of transistor 1, and will not be described again.

Figure 4A:
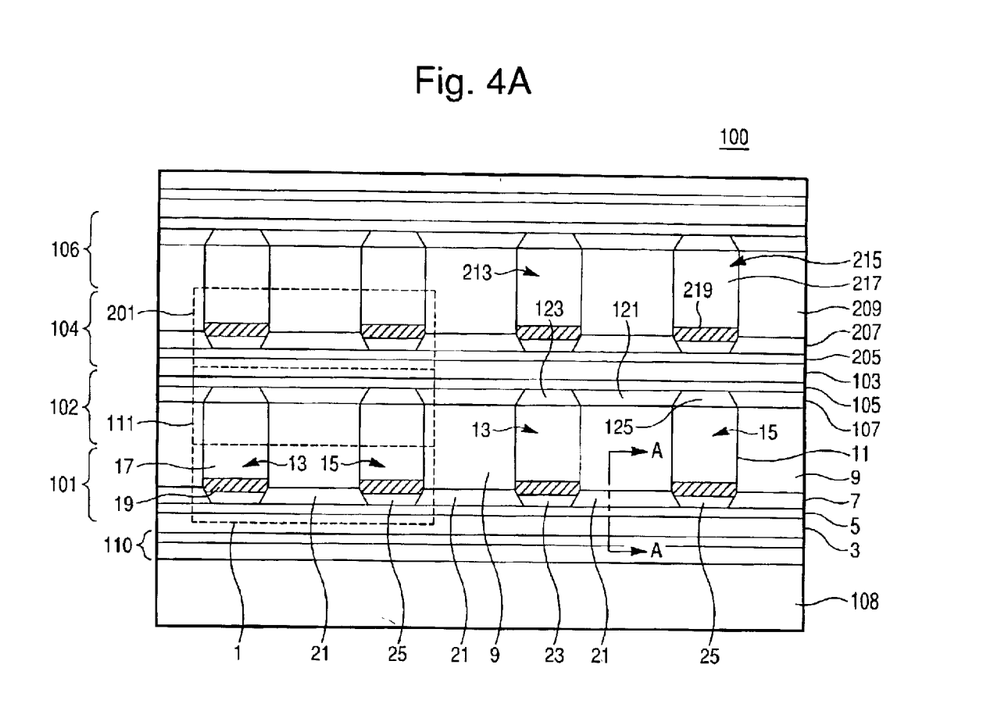
FIGS. 4A, 5 and 6 are side cross sectional views of three dimensional monolithic arrays of thin film transistor according to the fourth through sixth preferred embodiments of the present invention.
Figure 5:
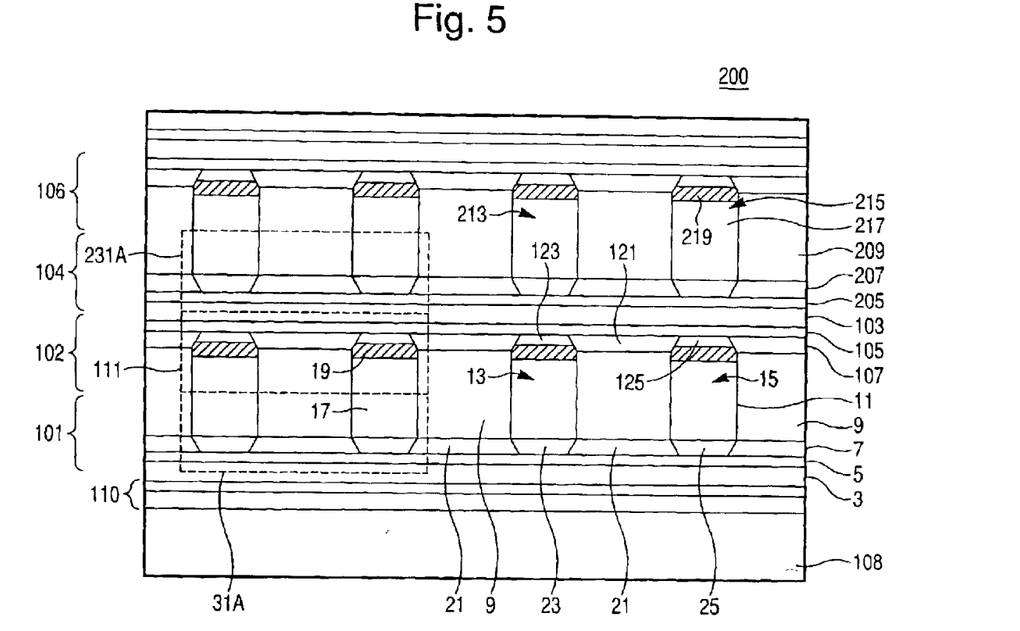
Figure 6:
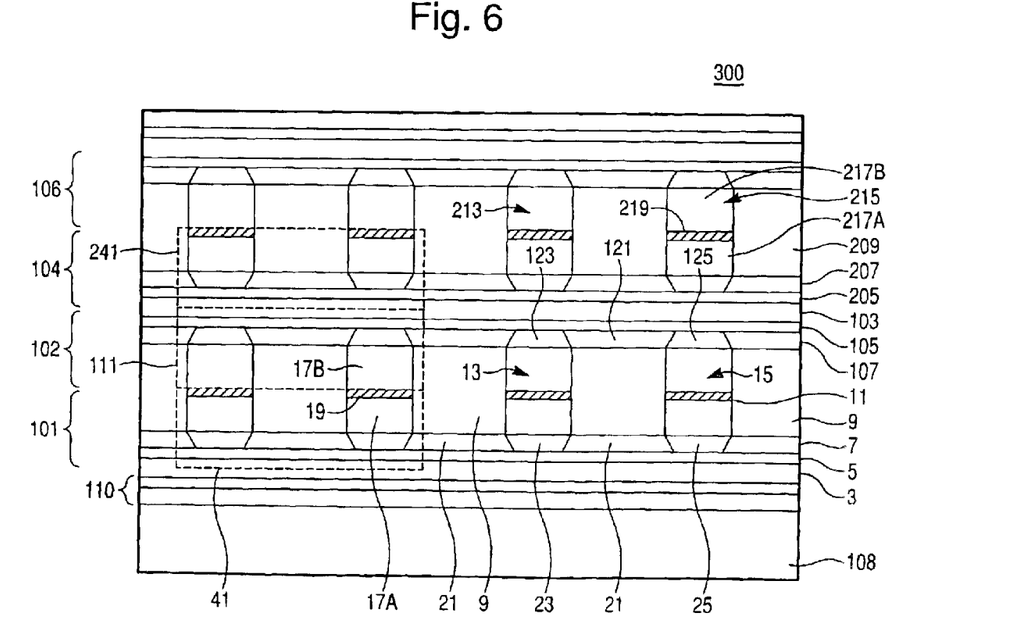

In fourth through sixth preferred embodiments of the present invention, the array comprises a monolithic, three dimensional array of thin film transistors, as shown in FIGS. 4–6. FIG. 4A illustrates an array 100 containing transistors 1 of the first preferred embodiment. FIG. 5 illustrates an array 200 containing transistors 31A of the second preferred embodiment. FIG. 6 illustrates an array 300 containing transistors 41 of the fourth preferred embodiment.

As shown in FIG. 4A, a first device level 101 of array 100 comprises a plurality of first inverted staggered thin film transistors 1. The second device 102 level is preferably monolithically formed over the first device level 101. The second device level 102 comprises a plurality of second thin film transistors. A device level is monolithically formed over a lower device level when it is deposited on the lower device level layer by layer, instead of the entire upper device layer being formed separately and then glued or bonded to the lower device layer.

Figure 4B:
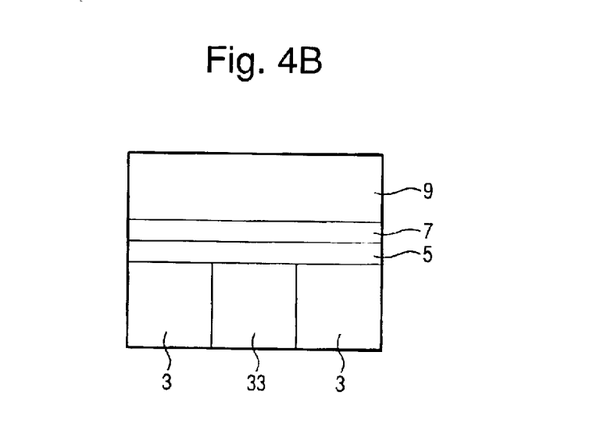
FIG. 4B is a side cross sectional view along line A–A' in FIG. 4A.

FIG. 4B is a side cross sectional view along line A—A in FIG. 4A. The array 100 contains a plurality of first gate lines 3 at a first height and extending in a first direction, as shown in FIG. 4B. If the transistors are charge storage transistors used for memory application, then the gate lines are often referred to as word lines. The first gate lines 3 are located at a first height above the substrate 108, such as a silicon or insulating substrate. One or more other layers, such as intermediate dielectric layer(s) 110 may be located between gate lines 3 and substrate 108, as shown in FIG. 4A.

A first planarized insulating fill layer 33 is located between the first gate lines 3, as shown in FIG. 4B. Fill layer 33 may comprise the same material as fill layer 9. A first gate insulating layer 5 is located on the first gate lines 3 and on the first insulating fill layer 33. If desired, layer 5 may comprise a portion of a charge storage region, as described above. The first active layer 7 is located on the first gate insulating layer 5. A second planar insulating fill layer 9 is located above the active layer. A plurality of openings 11 are located in the second fill layer 9.

A plurality of first source 13 and drain 15 lines are located in the openings 11 in the second insulating fill layer, in contact with the source 23 and drain 25 regions in the first active layer 7. It should be noted that each region 23, 25 is labeled as "source" or "drain" for convenience. However, each region can act as a source for one transistor and as a drain for an adjacent transistor. For example, region 25 can act as a drain for transistor 1 shown by dashed lines in FIG. 4A and as a source for an adjacent inverted staggered thin film transistor to the right of transistor 1 in FIG. 4A. Thus, each line 13, 15 is labeled as a "source" or "drain" line for convenience. Each line 13, 15 can act as a source line or a drain line.

The first source 13 and drain 15 lines extend in a second direction different from the first direction. The first source 13 and drain 15 lines contain a polysilicon layer 17 overlying a metal silicide layer 19. If transistors 1 are charge storage transistors for memory applications, then the source and drain lines are often referred to as bit lines, as described above.

A second active layer 107 is located over the first source 13 and drain 15 lines and over the second fill layer 9. A second gate insulating layer 105 is located over the second active layer 107. As discussed above, layer 105 may comprise a portion of a charge storage region if desired. A plurality of second gate lines 103 are located over the second gate insulating layer 105. The second gate lines 103 extend in the same direction as the first gate lines 3. A planarized third insulating fill layer (not shown in FIG. 4A) is located between adjacent second gate lines 103.

The array 100 contains a plurality of bottom gate staggered thin film transistors 1 and a plurality of top gate staggered thin film transistors 111. The channel 21, source 23 and drain 25 regions of each first transistor 1 are located in a portion of the first active layer 7. A gate insulating region of each first transistor 1 is located in a portion of the first gate insulating layer 5. A gate electrode of each first transistor 1 is located in a portion of one of the first gate lines 3.

The channel 121, source 123 and drain 125 regions of each second transistor 111 are located in a portion of the second active layer 107. The gate insulating region of each second transistor 111 is located in a portion of the second gate insulating layer 105. The gate electrode of each second transistor 111 is located in a portion of one of the second gate lines 103.

Thus, as shown in FIG. 4A, the first 1 and the second 111 transistors share the first source 13 and drain 15 lines. The first device level 101 contains the first gate lines 3 and the first source 13 and drain 15 lines. The second device level 102 contains the second gate lines 103 and the first source 13 and drain 15 lines.

If desired, the array 100 contains additional device levels. For example, a third gate insulating layer 205 is located over the second gate lines 103. If desired, layer 205 may comprise a portion of a charge storage region, as described above. A third active layer 207 is located over the third gate insulating layer 205. A fourth insulating fill layer 209 is located over the third active layer 207. A plurality of second source 213 and drain 215 lines are located in openings in the fourth insulating fill layer and in contact with the third active layer 207. The second source 213 and drain 215 lines extend in the same direction as the first source 13 and drain 15 lines. The second source 213 and drain 215 lines contain a bit line polysilicon layer 217 overlying a bit line metal silicide layer 219. Thus, a plurality of third inverted staggered thin film transistors 201 are located above the second top gate transistors 111.

As shown in FIG. 4A, the second 111 and the third 201 transistors share the second gate lines 103. The channel, source and drain regions of each third transistor 201 are located in a portion of the third active layer 207. A gate insulating region of each third transistor 201 is located in a portion of the third gate insulating layer 205. A gate electrode of each third transistor 201 is located in a portion of one of the second gate lines 103. The source and drain lines of each third transistor comprise the second source 213 and drain 215 lines.

If desired, additional device levels, such as level 106, may be formed on level 104 in the array 100 as shown in FIG. 4A. These device levels alternate the inverse staggered thin film transistors and top gate thin film transistors in the manner described above. The array 100 may have any desired number of levels, such as two to eight levels.

For EPROM or EEPROM applications, all transistors 1, 111, 201 are of the same conductivity type (i.e., p or n-type) and have a charge storage region. In an alternative embodiment of the invention, the array 100 is used for logic or random access memory application. In this embodiment, the first 1 and second 111 transistors preferably comprise metal oxide semiconductor transistors of a first conductivity type and the third transistors 201 comprise metal oxide semiconductor transistors of a second conductivity type. Thus, the transistors that share source and drain lines have the same conductivity type, while transistors which share gate lines have an opposite conductivity type. This makes it possible to form CMOS type logic or memory building blocks.

The present invention is not limited to the array 100 configuration shown in FIG. 4A. Other array configurations, such as those described in U.S. published application 20020028541, incorporated herein by reference, may be used instead. For example, the array may contain only inverse staggered thin film transistors separated by an interlevel dielectric layer. The array 100 contains a plurality of adjacent transistors in each device level. Preferably, adjacent transistors share a common bit line and a common source or drain region. However, if desired, adjacent transistors may be separated by an isolation region, such as a trench filled by a dielectric material, and not share bit lines and source or drain regions.

FIG. 5 illustrates a monolithic array 200 according to the fifth preferred embodiment. The array 200 is similar to array 100 except that array 200 contains the inverted staggered thin film transistors 31A, 231A of the second preferred embodiment in place of the inverted staggered thin film transistors 1, 201 of the first preferred embodiment. In the array 200, the bit line polysilicon layer 17 contacts the source 23 and drain 25 regions of the inverted staggered thin film transistors 31A. The bit line metal silicide layer 19 contacts the source 123 and drain 125 regions of the second top gate thin film transistors 111. The second active layer 107 is deposited on the metal silicide layer 19. Similarly, a bit line metal silicide layer 219 is located on the polysilicon bit line layer 217 in the second source 213 and drain 215 lines. All other features of array 200 are the same as the corresponding features of array 100, and will not be described again.

In another preferred aspect of the fifth embodiment, the polysilicon bit line layers 17, 217 are located between two metal silicide layers, in the manner shown in FIG. 2B. The lower bit line metal silicide layer contacts the source 23 and drain 25 regions of the inverted staggered thin film transistors 1, as shown in FIG. 4A. The upper bit line metal silicide layer contacts the source 123 and drain 125 regions of the second top gate thin film transistors 111, as shown in FIG. 5. In this aspect of the fifth embodiment, the array 200 contains the inverted staggered thin film transistors 31B.

FIG. 6 illustrates a monolithic array 300 according to the sixth preferred embodiment. The array 300 is similar to array 100 except that array 300 contains the inverted staggered thin film transistors 41, 241 of the second preferred embodiment in place of the inverted staggered thin film transistors 1, 201 of the first preferred embodiment. In the array 300, the bit line metal silicide layer 19 is located between two bit line polysilicon layers 17A, 17B. Thus, the bit line metal silicide layer 19 is arranged in a so-called "parfait" structure. Lower bit line polysilicon layer 17A contacts the source 23 and drain 25 regions of the inverted staggered thin film transistors 1. Upper bit line polysilicon layer 17B contacts the source 123 and drain 125 regions of the second top gate thin film transistors 111. The second active layer 107 is deposited on the upper bit line polysilicon layer 17B. Similarly, a bit line metal silicide layer 219 is located between upper and lower bit line polysilicon layers 217A, 217B in the second source 213 and drain 215 lines. All other features of array 300 are the same as the corresponding features of array 100, and will not be described again.

A method of making the inverted staggered thin film transistors of the preferred embodiments shown in FIGS. 1–3 will now be described. A gate electrode 3 is formed over a substrate. For example, the gate electrode may comprise a first heavily doped polysilicon layer 27 over a titanium/titanium nitride film 29 over a second heavily doped polysilicon layer 26. Preferably, layer 27 is about 2000 to 3000 Angstroms thick and layer 26 is about 1000 to 3000 Angstroms thick. Layers 27 and 26 are preferably heavily P-type doped to a concentration of $1\times10^{19}$ to $5\times10^{21}$ cm$^{-3}$, preferably $1\times10^{20}$ to $5\times10^{21}$ cm$^{-3}$. Layers 27 and 26 may be doped in situ during deposition or by ion implantation after deposition. The titanium layer may be about 100 to 500 Angstroms thick titanium layer deposited by physical vapor deposition (PVD) or ionized metal plasma PVD (IMP-PVD). The titanium nitride layer may be an about 100 to 200 Angstrom TiN layer deposited by PVD, IMP-PVD or metal organic chemical vapor deposition (MOCVD). However, any other suitable materials, deposition methods and layer thickness may be used instead. Preferably, the titanium layer reacts with the lower polysilicon layer 26 during a subsequent anneal to form a titanium silicide layer.

A gate insulating layer 5 is formed over the gate electrode 3. Preferably, the gate insulating layer 5 comprises a portion of a ONO dielectric charge storage film (i.e., a stack of silicon oxide/silicon nitride or oxynitride/silicon oxide layers). The ONO dielectric film preferably comprises a tunnel silicon oxide, a charge storage $Si_3N_{4-x}O_{1.5x}$ layer, where x is 0 to 1, and a blocking silicon oxide. The tunnel oxide may have a thickness of 1.5 nm to 7 nm, preferably 2 nm to 3 nm. The charge storage silicon nitride or silicon oxynitride ($Si_3N_{4-x}O_{1.5x}$) layer may have a thickness of at least 4 nm, preferably 4 to 15 nm, most preferably 5 nm to 6 nm. The blocking oxide layer may have a thickness of 3 nm to 9 nm, preferably 3.5 nm to 4.5 nm. The ONO film may be deposited by chemical vapor deposition, physical vapor deposition and/or by chemical reaction with the upper gate line polysilicon layer 27 (i.e., by thermally oxidizing the polysilicon layer 27 to form the tunnel oxide).

An active layer 7 is formed over the gate insulating layer 5. The active layer may be an about 100 to 1000 Angstrom thick lightly doped polysilicon layer doped P-type to a concentration of $1\times10^{16}$ to $1\times10^{18}$ cm$^{-3}$, preferably below $1\times10^{16}$ to $5\times10^{17}$ cm$^{-3}$. Layer 7 may be doped by ion implantation after deposition or in-situ doped during deposition.

An insulating fill layer 9 is formed over the active layer. As discussed above, the fill layer may comprise any suitable insulating material, but preferably comprises a PECVD silicon oxide layer. The fill layer may have a thickness of about 2000 to 6000 Angstroms, preferably about 2500 to 4500 Angstroms.

The fill layer 9 is photolithographically patterned to form the openings 11 through which portions of the active layer 7 are exposed. Preferably, the source 23 and drain 25 regions are formed in the active layer 7 at this time by implanting dopant ions through the openings 11 in the fill layer. The ion implantation can take place before or after the photoresist mask used to pattern openings 11 is removed from the fill layer 9. The remaining fill layer 9 acts as an ion implantation mask such that the dopants are not implanted into the channel region 21 in the active layer.

Figure 7:
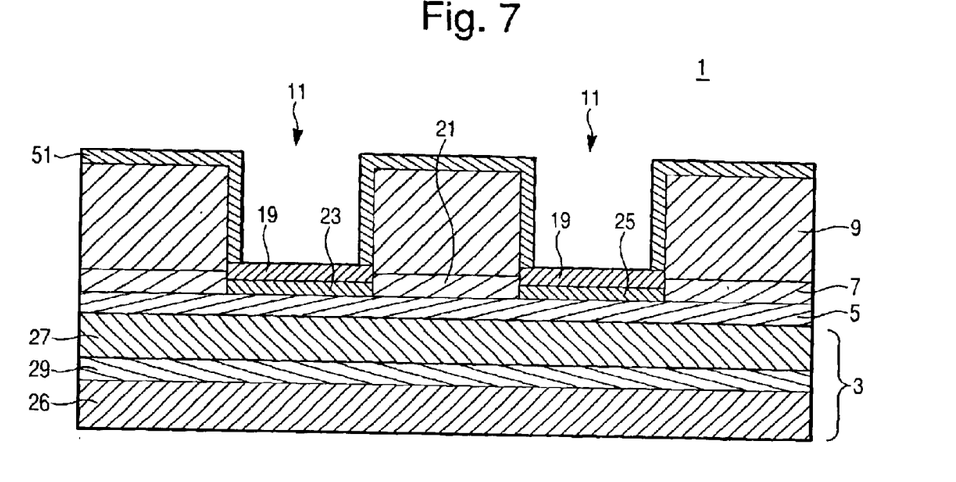
FIGS. 7–12 are side cross sectional views of steps in methods of making thin film transistors according to the preferred embodiments of the present invention.

To form the transistor 1 of the first preferred embodiment, a metal layer 51 is formed in the openings 11 and over a top surface of the fill layer 9, as shown in FIG. 7. The metal layer 51 may be any layer which forms a metal suicide layer when it reacts with silicon. Preferably, metal layer 51 comprises a cobalt, titanium or nickel layer. The metal layer 51 may have any suitable thickness that can form a metal silicide layer by reaction with a portion of the polysilicon active layer 7 without converting the entire thickness of the active layer 7 to metal silicide. Thus, the thickness of the metal silicide layer 51 is preferably proportional to the thickness of the active layer 7. For example, layer 51 may comprise a 20 to 300 Angstrom, preferably 50 to 100 Angstrom thick cobalt layer deposited by physical vapor deposition, such as by the IMP-PVD method.

The metal layer 51 is then annealed, such as by rapid thermal annealing (RTA), to react layer 51 with the exposed source 23 and drain 25 regions in the silicon active layer 7 to selectively form the metal silicide layer 19 on the source 23 and drain 25 regions in openings 11. Unreacted portions of the metal layer 51 remaining on the sidewalls of the opening 11 and on the top surface of the insulating fill layer 9 are then removed using selective etching. Thus, the source and drain electrodes are formed by a version of the salicide process.

In an alternative aspect of the first embodiment, the source 23 and drain 25 ion implantation takes place after the metal silicide layer 19 is formed. The ions are implanted through the metal silicide layer 19 into the active layer 7 using the patterned fill layer 9 as a mask.

Figure 8:
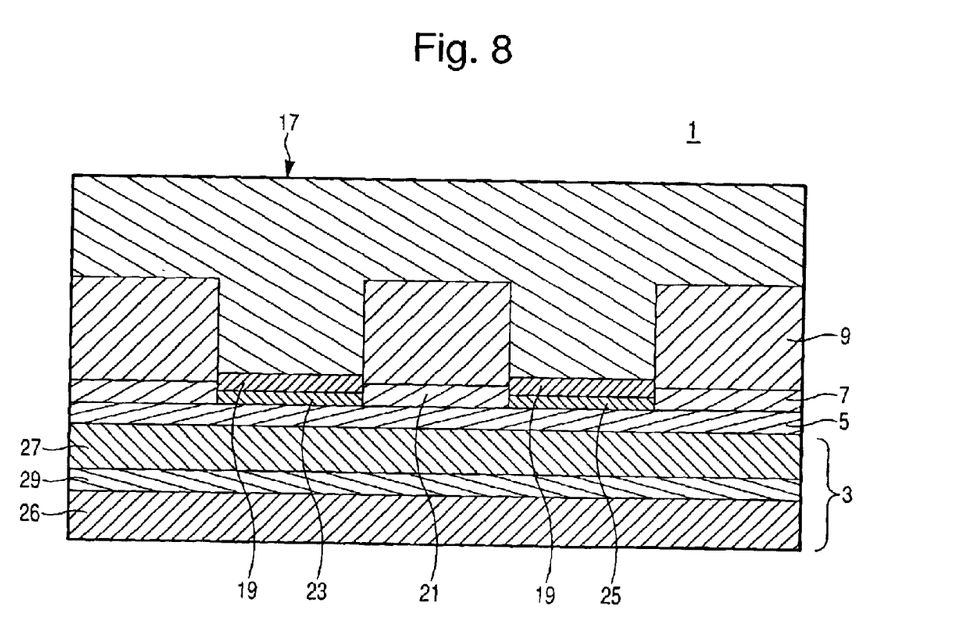

As shown in FIG. 8, a polysilicon layer 17 is then formed over the metal silicide layer 19 in openings 11 and over the insulating fill layer 9 to form a source/drain line film containing layers 19 and 17. The polysilicon layer 17 may be 2500 to 7000 Angstroms, preferably 3000 to 5000 Angstroms thick and heavily N-type doped to a concentration of $1 \times 10^{19}$ to $5 \times 10^{21}$ cm$^{-3}$, preferably $1 \times 10^{20}$ to $5 \times 10^{21}$ cm$^{-3}$. Layer 17 may be doped in situ during deposition or by ion implantation after deposition. The polysilicon layer 17 is then planarized by etch back or chemical mechanical polishing until the top of the polysilicon layer 17 remaining in the openings is coplanar with the top surface of the insulating fill layer 9, as shown in FIG. 1.

Alternatively, the polysilicon layer 17 may be formed by depositing an amorphous silicon layer first, followed by annealing the amorphous silicon layer to convert it to a polysilicon layer.

Figure 9:
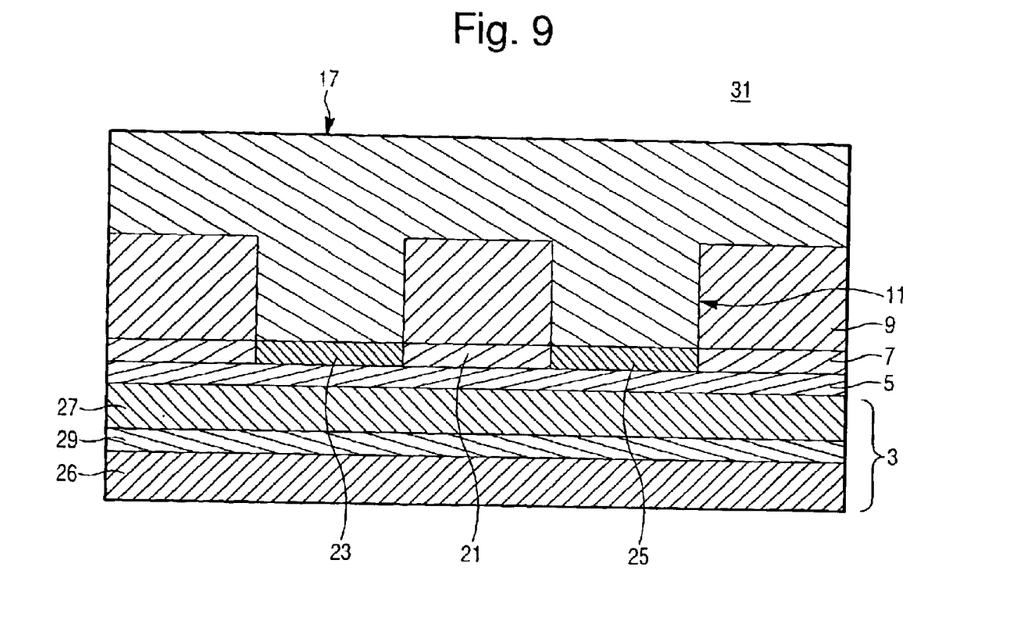

To form the transistor 31A of the second preferred embodiment shown in FIG. 2A, the order of steps is reversed from the order of steps used to make transistor 1 of the first preferred embodiment. To form transistor 31A, the polysilicon layer 17 is formed over the insulating fill layer 9 and in the openings 11 such that the polysilicon layer 17 contacts the active layer 7, as shown in FIG. 9. The polysilicon layer 17 is then planarized by etch back or chemical mechanical polishing until the top of the polysilicon layer 17 remaining in the openings 11 is coplanar with the top surface of the insulating fill layer 9.

Figure 10:
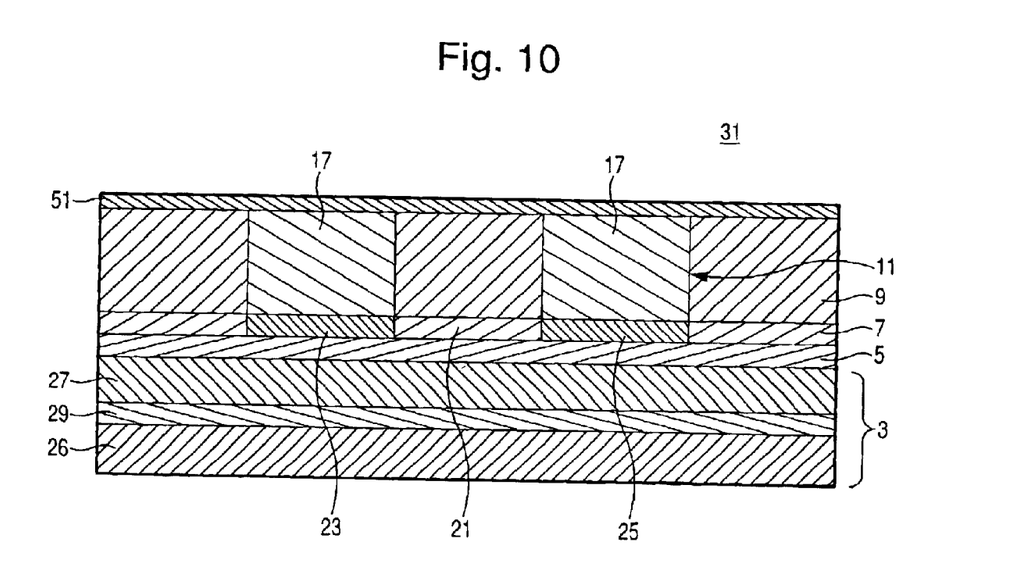

The metal layer 51 is then deposited over the polysilicon layer 17 and the insulating fill layer 9, as shown in FIG. 10. The metal layer 51 is annealed to react the metal layer 51 with the polysilicon layer 17 located in openings 11 to selectively form the metal suicide layer 19 located on the polysilicon layer 17 in openings 11. The unreacted metal layer 51 remaining on the top surface of the fill layer 9 is removed by selective etching. Thus, source 13 and drain 15 electrodes comprising the source/drain line film 17, 19 are formed in the openings 11 in fill layer 9, as shown in FIG. 2A.

If desired, the source 23 and drain 25 regions of transistor 31 may be formed by outdiffusion rather than by ion implantation through the openings 11. In this alternative method, the dopants are outdiffused from the heavily doped polysilicon layer 17 into the active layer 7 to form the source 23 and drain 25 regions. The outdiffusion may take place during the step of annealing the metal layer 51 to form the metal silicide layer 19, or during a separate annealing step carried out before or after the formation of the metal silicide layer 19.

To form the transistor 31B containing two metal silicide layers 19A and 19B shown in FIG. 2B, the steps of the methods of the first and second embodiments are combined. The lower metal silicide layer 19A is formed using the method of the first preferred embodiment illustrated in FIG. 7. The upper metal silicide layer 19B is formed using the method of the second preferred embodiment illustrated in FIG. 10.

Figure 11:
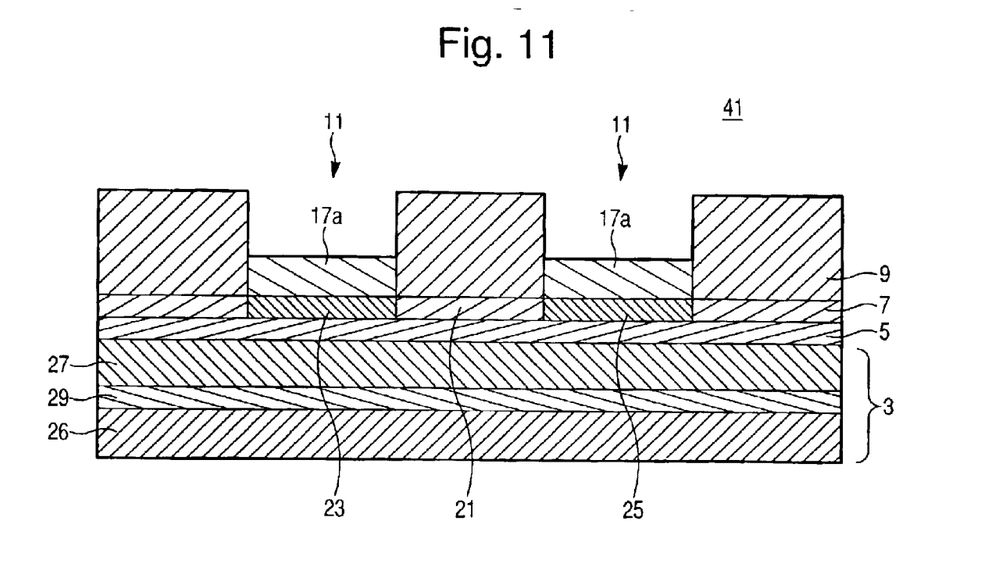

To form the transistor 41 of the third preferred embodiment shown in FIG. 3, a first polysilicon layer 17A is formed such it partially fills the openings 11 in the fill layer 9, as shown in FIG. 11. Preferably, the first polysilicon layer 17A is formed in the openings 11 in the fill layer 9 and over the fill layer 9. The polysilicon layer 17A is then selectively etched back such that the first polysilicon layer 17A does not completely fill the openings.

Figure 12:
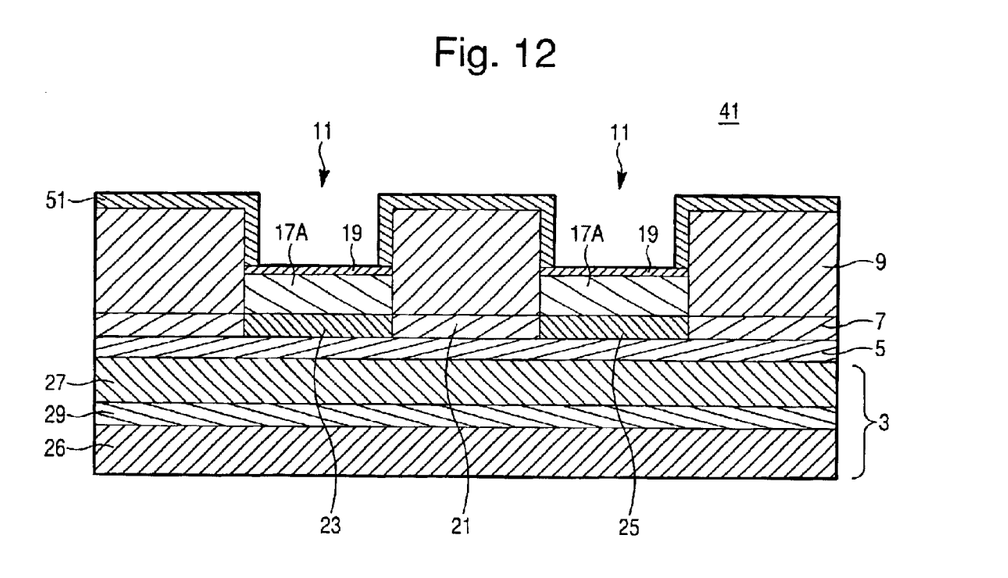

The metal silicide layer 19 is then selectively formed on the first polysilicon layer 17A in openings 11. The metal layer 51 is formed on the first polysilicon layer 17A and fill layer 9 and then reacted with the first polysilicon layer to form the silicide layer 19, as shown in FIG. 12. The unreacted portions of the metal layer 51 are then removed by selective etching.

A second polysilicon layer 17B is formed on the metal silicide layer 19 in the openings 11 and over the insulating fill layer 9. The second polysilicon layer 17B is then planarized by chemical mechanical polishing or etch back until it is coplanar with the top surface of the fill layer 9, as shown in FIG. 3.

While it is preferred to form the metal silicide layer 19 and the polysilicon layer 17 (or layers 17A, 17B) in openings 11 in the fill layer 9, the order of steps may be reversed. In this alternative method, metal silicide 19 and polysilicon 17 bit lines may be formed on the active layer 7 by photolithography first, followed by the deposition of the insulating fill layer 9 around the bit lines.

A method of making the arrays 100, 200 and 300 of thin film transistors according to the fourth, fifth and sixths preferred embodiments of the present invention, respectively, will now be described. A first gate line layer is formed over a substrate. This layer is photolithographically patterned to form a plurality of first gate lines 3.

A first insulating fill layer 33 is formed over and between the first gate lines 3. The first fill layer 33 is planarized with a top surface of the first gate lines 3 by chemical mechanical polishing or etchback. Alternatively, the gate lines 3 may be formed in openings in the first fill layer 33, if desired.

A first gate insulating layer 5 is formed over the first gate lines 3 and the first fill layer 33. A first active layer 7 is formed over the first gate insulating layer 5. A second insulating fill layer 9 is formed over the first active layer 7.

The second insulating fill layer 9 is then photolithographically patterned such that first portions 21 of the first active layer 7 are covered by the second insulating fill layer 9. Openings 11 in the second insulating fill layer 9 expose second portions 23, 25 of the first active layer 7.

A first source/drain line film comprising a first polysilicon layer 17 (or 17A) and a first metal silicide layer 19 are then formed in the openings 11 in the second insulating fill layer 9, as described with respect to the first, second and third embodiments. The first source/drain line film is then planarized such that first source 13 and drain 15 electrodes remain in the openings 11 in the second insulating fill layer 9, and top surfaces of the source and drain electrodes are coplanar with a top surface of the second insulating fill layer 9.

Specifically, the source 13 and drain 15 lines in the array 100 of the fourth preferred embodiment are formed by the method of the first preferred embodiment used to form transistor 1. The source 13 and drain 15 lines in the array 200 of the fifth preferred embodiment are formed by the method of the second preferred embodiment used to form transistors 31A or 31B. The source 13 and drain 15 lines in the array 300 of the sixth preferred embodiment are formed by the method of the third preferred embodiment used to form transistor 41.

If desired, the arrays 100, 200, 300 may be formed as a monolithic three dimensional arrays. A second active layer 107 is deposited over the first source 13 and drain 15 lines and over the second fill layer 9.

In the method of making arrays 100 and 300, the second active layer is annealed to outdiffuse dopants from the heavily doped polysilicon layer 17, 17B, respectively, into the second active layer 107 to form source 123 and drain 125 regions in the second active layer 107. In the method of making array 200, dopant ions are implanted into the metal silicide layer 19 located in the top portion of the first source 13 and drain 15 electrodes prior to depositing the second active layer 107. The second active layer 107 is then annealed to outdiffuse dopants from the metal silicide layer 19 into the second active layer 107 to form source 123 and drain 125 regions in the second active layer 107.

A second gate insulating layer 105 is formed over the second active layer 107 and second gate lines 103 are formed over the second gate insulating layer 105. Thus, the top gate thin film transistors 111 are formed over bottom gate or inverted thin film transistors 1, 31A, 31B or 41.

To form additional device levels, alternating sets of inverted and top gate thin film transistors are formed over each other as described above. For example, to form a third device level containing inverted thin film transistors 201, 231A or 241, a third insulating fill layer is formed over and between the second gate lines 103 in a manner similar to the first fill layer 33. The third fill layer is planarized with a top surface of the second gate lines 103. A third gate insulating layer 205 is formed over the second gate lines 103 and the third fill layer. A third active layer 207 is formed over the third gate insulating layer 205. A fourth fill layer 209 is formed over the third active layer 207. The fourth fill layer 209 is selectively patterned such that channel portions of the third active layer 207 are covered by the fourth insulating fill layer and openings in the second insulating fill layer expose source and drain portions of the third active layer 207.

A second source/drain line film is then formed over the fourth patterned insulating fill layer 209 and in the openings in the fourth patterned insulating fill layer. The second source/drain line film is planarized similarly to the first source/drain line film such that second source 213 and drain 215 electrodes remain in the openings in the fourth patterned insulating fill layer 209 and top surfaces of the second source and drain electrodes are coplanar with a top surface of the fourth insulating fill layer.

If desired, additional device levels, such as level 106 shown may be formed in the arrays 100, 200, 300. As discussed above, if it is desired to form charge storage transistors, then the gate insulating layers 5, 105 and 205 comprise portion of a charge storage region.

The arrays 100, 200, 300 of the preferred embodiments of the present invention may be used in nonvolatile flash memory devices such as EEPROMs and as non-flash EEPROMs (i.e., EEPROMs where each transistor is erased separately), UV erasable PROMs (EPROMs), mask ROMs, dynamic random access memories (DRAMs), liquid crystal displays (LCDs), field programmable gate arrays (FPGA) and microprocessors.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the array in schematic block format. It is intended that the scope of the invention be defined by the claims appended hereto, and their equivalents.

What is claimed is:

1. A semiconductor device, comprising:
   a gate electrode;
   a gate insulating layer located above the gate electrode;
   an active layer located above the gate insulating layer;
   an insulating fill layer located above the active layer;
   a first opening and a second opening located in the insulating fill layer;
   a first source or drain electrode located in the first opening;
   a second source or drain electrode located in the second opening; and
   wherein at least one of the first and the second source or drain electrodes comprises a polysilicon layer and a metal silicide layer.

2. The device of claim 1, wherein the gate insulating layer comprises a portion of a charge storage region.

3. The device of claim 1, wherein a top surface of the first source or drain electrode and a top surface of the second source or drain electrode are substantially coplanar with a top surface of the insulating fill layer.

4. The device of claim 3, wherein the metal silicide layer is located in contact with the active layer and the polysilicon layer is located above the metal silicide layer.

5. The device of claim 3, wherein the polysilicon layer is located in contact with the active layer and the metal silicide layer is located above the polysilicon layer.

6. The device of claim 3, wherein the metal silicide layer is located between the polysilicon layer and a second polysilicon layer.

7. The device of claim 3, wherein:
the metal silicide layer is located in contact with the active layer;
the polysilicon layer is located above the metal silicide layer; and
a second metal silicide layer is located above the polysilicon layer in the at least one source and drain electrode.

8. The device of claim 1, wherein:
transistor source and drain regions are located in the active layer, the source region contacting the first source or drain electrode and the drain region contacting the second source or drain electrode;
a transistor channel region is located in the active layer between the first and second source and drain regions and below the insulating fill layer; and
the gate insulating layer comprises a portion of a charge storage region.

9. The device of claim 8, wherein:
the charge storage region comprises:
  a dielectric isolated floating gate;
  an insulating layer containing conductive nanocrystals; or
  a composite dielectric film comprising a tunneling layer, a charge storage layer and a blocking dielectric layer;
the active layer comprises a polysilicon active layer;
the insulating fill layer comprises silicon dioxide; and
the metal silicide layer comprises a titanium silicide layer, a cobalt silicide layer or a nickel silicide layer.

10. The device of claim 9, further comprising:
a plurality of gate lines located at a first height and extending in a first direction;
a plurality of source and drain lines located at a second height above the first height and extending in a second direction different from the first direction; and
a plurality of charge storage regions and active layers located between the plurality of gate lines and the plurality of source and drain lines, such that a plurality of first inverted staggered thin film transistors are located at intersections of the gate lines and the source and drain lines in a first device level.

11. The device of claim 10, further comprising at least one subsequent device level monolithically formed above the first device level, wherein the at least one subsequent device level comprises a plurality of second thin film transistors.

12. A monolithic, three dimensional array of thin film transistors, comprising:
a substrate;
an intermediate dielectric layer located above the substrate;
a first planarized insulating fill layer located at a first height above the intermediate dielectric layer;
a first plurality of openings located in the first planarized insulating fill layer;
a plurality of first word lines located in the first plurality of openings in the first planarized insulating fill layer and extending in a first direction;
a first gate insulating layer located above the first word lines and above the first insulating fill layer;
a first active layer located above the first gate insulating layer;
a second insulating fill layer located above the first active layer;
a second plurality of openings located in the second insulating fill layer;
first bit lines located in the second plurality of openings in the second insulating fill layer, wherein at least one of the first bit lines comprises a first polysilicon layer and a first metal suicide layer, and the first bit lines extend in a second direction different from the first direction;
a second active layer located above the first bit lines and above the second insulating fill layer;
a second gate insulating layer located above the second active layer; and
a plurality of second word lines located above the second gate insulating layer, the second word lines extending in the first direction.

13. The array of claim 12, wherein:
the first gate insulating layer comprises a portion of a first charge storage region;
the second gate insulating layer comprises a portion of a second charge storage region; and
top surfaces of the first bit lines are substantially coplanar with a top surface of the second insulating fill layer.

14. The array of claim 13, wherein the first metal silicide layer is located in contact with the first active layer and the first polysilicon layer is located above the first metal silicide layer and in contact with the second active layer.

15. The array of claim 13, wherein the first polysilicon layer is located in contact with the first active layer and the first metal silicide layer is located above the first polysilicon layer and in contact with the second active layer.

16. The array of claim 13, wherein the first metal suicide layer is located between the first polysilicon layer and a second polysilicon layer.

17. The array of claim 13, wherein:
the first metal silicide layer is located in contact with the first active layer;
the first polysilicon layer is located above the first metal silicide layer; and
a second metal silicide layer is located above the polysilicon layer in the at least one of the first bit lines.

18. The array of claim 13, further comprising:
first transistor source and drain regions located in the first active layer in contact with the first bit lines;
second transistor source and drain regions located in the second active layer in contact with the first bit lines;
first transistor channel regions located in the first active layer alternating with the first source and drain regions;
second transistor channel regions located in the second active layer alternating with the second source and drain regions;
a third planarized insulating fill layer;
a third plurality of openings in the third planarized insulating fill layer, wherein the second word lines are located in the third plurality of openings;
a third charge storage region located on the second word lines and the third insulating fill layer;
a third active layer located on the third charge storage region;

a fourth insulating fill layer located above the third active layer;

a fourth plurality of openings located in the fourth insulating fill layer; and second bit lines located in the fourth plurality of openings in the fourth insulating fill layer, wherein the second bit lines comprise a second polysilicon layer and a second metal silicide layer, and the second bit lines extend in the second direction.

19. The array of claim 18, wherein:

at least one of the first word lines comprise a metal silicide layer located between two first word line heavily doped polysilicon layers;

at least one of the second word lines comprise a metal silicide layer located between two second word line heavily doped polysilicon layers;

the first, second and third charge storage regions are selected from a group consisting of:
a dielectric isolated floating gate;
an insulating layer containing conductive nanocrystals; and
a composite dielectric film comprising a tunneling layer, a charge storage layer and a blocking dielectric;

the first, second and third active layers comprise polysilicon active layers; and the first and second source and drain regions comprise heavily doped polysilicon regions.

20. A method of making a semiconductor device, comprising: forming a first gate line layer, patterning the first gate line layer to form a plurality of first gate lines, wherein at least one gate electrode is provided in the plurality of first gate lines; forming a first insulating fill layer over and between the first gate lines; planarizing the first fill layer coplanar with top surfaces of the first gate lines; forming a first gate insulating layer over the first gate lines and the first fill layer; forming a first active layer over the first gate insulating layer, forming a second insulating fill layer over the first active layer; patterning the second insulating fill layer such that first portions of the first active layer are covered by the second insulating fill layer and openings in the second insulating fill layer expose second portions of the first active layer; forming a first source/drain line film comprising a first polysilicon layer and a first metal silicide layer in the openings in the second insulating fill layer; and planarizing the first source/drain line film such that first source and drain electrodes remain in the openings in the second insulating fill layer, and top surfaces of the first source and drain electrodes are coplanar with a top surface of the second insulating fill layer; wherein the first source and drain electrodes in the completed semiconductor device comprise the first polysilicon layer and the first metal silicide layer.

21. The method of claim 20, wherein:

the first gate lines comprise a heavily doped polysilicon layer over a metal silicide layer;

the first insulating fill layer comprises a chemically mechanically polished silicon dioxide layer;

the second insulating fill layer comprises a silicon dioxide layer;

the first gate insulating layer comprises a portion of a charge storage region selected from a group consisting of:
a dielectric isolated floating gate;
an insulating layer containing conductive nanocrystals; and a composite dielectric film comprising a tunneling layer, a charge storage layer and a blocking oxide; and the first active layer comprises a polysilicon active layer.

22. The method of claim 20, wherein the steps of planarizing comprise chemical mechanical polishing.

23. The method of claim 22, wherein forming the first source/drain line film comprises forming the first polysilicon layer in the openings in the second insulating fill layer, such that the first polysilicon layer does not completely fill the openings, forming the first metal silicide layer on the first polysilicon layer, and forming a second polysilicon layer on the first metal silicide layer in the openings and over the second insulating fill layer.

24. The method of claim 22, wherein forming the first source/drain line film comprises forming the first polysilicon layer in the openings in the second insulating fill layer and over the second insulating fill layer, selectively etching back the first polysilicon layer such that the first polysilicon layer does not completely fill the openings, forming the first metal silicide layer on the first polysilicon layer, and forming a second polysilicon layer on the first metal silicide layer in the openings and over the second insulating fill layer.

25. The method of claim 22, further comprising implanting source and drain regions in the first active layer through the openings in the second insulating fill layer.

26. The method of claim 22, wherein forming the first source/drain line film comprises forming the first metal silicide layer in contact with the first active layer and forming the first polysilicon layer on the first metal silicide layer.

27. The method of claim 26, further comprising forming a second metal silicide layer on the first polysilicon layer.

28. The method of claim 22, wherein forming the first source/drain line film comprises forming the first polysilicon layer located in contact with the first active layer and selectively forming the first metal silicide layer on the first polysilicon layer after the step of planarizing the first source/drain line film.

29. The method of claim 28, further comprising annealing the first polysilicon layer to outdiffuse source and drain dopants from the first polysilicon layer into the first active layer.

30. The method of claim 22, further comprising:

depositing a second active layer over the first source and drain electrodes and over the second fill layer;

outdiffusing source and drain dopants from the first source and drain electrodes into the second active layer;

forming a second gate insulating layer over the second active layer; and forming second gate lines over the second gate insulating layer.

31. The method of claim 30, further comprising:

forming a third insulating fill layer over and between the second gate lines;

planarizing the third fill layer coplanar with top surfaces of the second gate lines;

forming a third gate insulating layer over the second gate lines and the third fill layer;

forming a third active layer over the third gate insulating layer;

forming a fourth insulating fill layer over the third active layer;

selectively patterning the fourth insulating fill layer such that first portions of the third active layer are covered by the fourth insulating fill layer and openings in the second insulating fill layer expose second portions of the third active layer;

forming a second source/drain line film over the fourth patterned insulating fill layer and in the openings in the fourth patterned insulating fill layer; and planarizing the second source/drain line film such that second source and drain electrodes remain in the openings in the fourth patterned insulating fill layer and top surfaces of the second source and drain electrodes are coplanar with a top surface of the fourth insulating fill layer.

32. A method of making an inverted staggered thin film transistor, comprising: forming a gate electrode; forming a gate insulating layer over the gate electrode; forming an active layer over the gate insulating layer; forming an insulating fill layer over the active layer; patterning the insulating fill layer such that first portions of the active layer are covered by the insulating fill layer and first and second openings in the insulating fill layer expose second portions of the active layer; forming a source/drain line film comprising a first polysilicon layer and a metal silicide layer in the first and second openings in the insulating fill layer; and planarizing the source/drain line film such that a first source or drain electrode remains in the first opening and a second source or drain electrode remains in the second opening in the insulating fill layer, and top surfaces of the first and second source or drain electrodes are coplanar with a top surface of the insulating fill layer; wherein the first and the second source or drain electrodes in the completed inverted staggered thin film transistor comprise the first polysilicon layer and the first metal silicide layer.

33. The method of claim 32, wherein forming the source/drain line film comprises forming the first polysilicon layer located in contact with the active layer and selectively forming the metal silicide layer on the first polysilicon layer after the step of planarizing the source/drain line film.

34. The method of claim 32, wherein forming the source/drain line film comprises forming the first polysilicon layer in the openings in the insulating fill layer and over the insulating fill layer, selectively etching back the first polysilicon layer such that the first polysilicon layer does not completely fill the openings, forming the metal silicide layer on the first polysilicon layer, and forming a second polysilicon layer on the metal silicide layer in the openings and over the insulating fill layer.

35. The method of claim 32, further comprising implanting source and drain regions in the active layer through the openings in the insulating fill layer.

36. The method of claim 32, further comprising:

forming the first polysilicon layer in contact with the active layer; and annealing the first polysilicon layer to outdiffuse source and drain dopants from the first polysilicon layer into the active layer.

37. The method of claim 32, further comprising:

forming a second active layer on the first polysilicon layer; and annealing the first polysilicon layer to outdiffuse source and drain dopants from the first polysilicon layer into the second active layer.

38. The method of claim 32, further comprising:

forming the metal suicide layer over the first polysilicon layer;

implanting dopants into the metal silicide layer;

forming a second active layer on the metal silicide layer; and annealing the metal silicide layer to outdiffuse source and drain dopants from the metal silicide layer into the second active layer.

39. The method of claim 32, wherein forming the source/drain line film comprises forming the metal silicide layer in contact with the active layer and forming the first polysilicon layer on the metal silicide layer.

40. The method of claim 39, further comprising forming a second metal silicide layer on the first polysilicon layer.

* * * * *